(12) United States Patent
Nozawa et al.

(10) Patent No.: US 7,402,228 B2
(45) Date of Patent: Jul. 22, 2008

(54) MANUFACTURING METHOD AND APPARATUS OF PHASE SHIFT MASK BLANK

(75) Inventors: Osamu Nozawa, Fuchu (JP); Hideaki Mitsui, Fuchu (JP)

(73) Assignee: Hoya Corporation (JP)

( * ) Notice: Subject to any disclaimer, the term of this patent is extended or adjusted under 35 U.S.C. 154(b) by 0 days.

(21) Appl. No.: 10/771,997

(22) Filed: Feb. 4, 2004

(65) Prior Publication Data

US 2004/0157138 A1 Aug. 12, 2004

Related U.S. Application Data

(62) Division of application No. 09/952,445, filed on Sep. 12, 2001, now Pat. No. 6,783,634.

(30) Foreign Application Priority Data

Sep. 12, 2000 (JP) ............................. 2000-277354

(51) Int. Cl.
*C23C 14/35* (2006.01)
(52) U.S. Cl. ..................... 204/298.25; 204/298.23; 204/298.28
(58) Field of Classification Search ............ 204/298.23, 204/298.28, 298.25; 430/5
See application file for complete search history.

(56) References Cited

U.S. PATENT DOCUMENTS

| | | | | |
|---|---|---|---|---|
| 4,096,026 A | * | 6/1978 | Takeuchi | 216/12 |
| 4,388,034 A | * | 6/1983 | Takahashi | 414/331.17 |
| 4,975,168 A | * | 12/1990 | Ohno et al. | 204/192.13 |
| 5,626,727 A | | 5/1997 | Yamanishi et al. | |
| 5,714,285 A | * | 2/1998 | Tu et al. | 430/5 |
| 5,798,027 A | * | 8/1998 | Lefebvre et al. | 204/192.26 |
| 5,897,977 A | | 4/1999 | Carcia et al. | 430/5 |
| 5,934,856 A | * | 8/1999 | Asakawa et al. | 414/217 |
| 5,955,223 A | | 9/1999 | Mitsui et al. | 430/5 |
| 6,086,728 A | * | 7/2000 | Schwartz et al. | 204/192.12 |
| 6,286,452 B1 | * | 9/2001 | Namiki et al. | 118/723 E |

(Continued)

FOREIGN PATENT DOCUMENTS

JP 2000-303172 * 10/2000

(Continued)

OTHER PUBLICATIONS

Machine Translation of 2000-303172.*

*Primary Examiner*—Rodney G McDonald
(74) *Attorney, Agent, or Firm*—Cook, Alex, McFarron, Manzo, Cummings & Mehler, Ltd.

(57) ABSTRACT

There is disclosed a manufacturing method of a phase shift mask blank in which dispersions of phase angle and transmittance among blanks can be reduced as much as possible and yield is satisfactory. In the manufacturing method of the phase shift mask blank, a process of using a sputtering method to continuously form a thin film on a transparent substrate comprises: successively subjecting a plurality of substrates to a series of process of supplying the transparent substrate into a sputtering chamber, forming the thin film for forming a pattern in the sputtering chamber, and discharging the transparent substrate with the film formed thereon from the sputtering chamber; supplying and discharging the transparent substrate substantially at a constant interval; and setting a film formation time to be constant among a plurality of blanks.

8 Claims, 6 Drawing Sheets

U.S. PATENT DOCUMENTS

| | | |
|---|---|---|
| 6,419,802 B1 * | 7/2002 | Baldwin et al. ........ 204/192.13 |
| 6,475,354 B1 * | 11/2002 | Toyama ................. 204/192.13 |
| 6,669,987 B1 * | 12/2003 | Schaefer et al. .......... 427/248.1 |
| 2002/0017910 A1 * | 2/2002 | Sakai ......................... 324/750 |
| 2002/0106830 A1 | 8/2002 | Ohmi et al. ................... 438/69 |
| 2002/0197509 A1 * | 12/2002 | Carcia et al. ................ 428/689 |

FOREIGN PATENT DOCUMENTS

WO      WO 00/63460    * 10/2000

* cited by examiner

(b) LIGHT AMPLITUDE DISTRIBUTION OF MASK (c) LIGHT STRENGTH DISTRIBUTION ON TRANSFER MATERIAL

MANUFACTURING METHOD AND APPARATUS OF PHASE SHIFT MASK BLANK

This application is a divisional of U.S. application Ser. No. 09/952,445 filed Sep. 12, 2001 (now U.S. Pat. No. 6,783,634 issued Aug. 31, 2004).

BACKGROUND OF THE INVENTION i) Field of the Invention

The present invention relates to a manufacturing method and apparatus of a phase shift mask blank which is suitable particularly for ArF or $F_2$ excimer laser.

ii) Description of the Related Art

In recent years, it has become clear that high resolution and depth of focus are two important properties required for photolithography but are in a contradictory relation with each other, and that a practical resolution cannot be enhanced using only a short wavelength laser and an exposure apparatus with a lens having a high numerical aperture ("NA"). (Monthly Semiconductor World 1990.12, Applied Physics Vol. 60, November, 1991, and the like).

In such a situation, phase shift lithography has been noted as the next-generation photolithography technique, and partially brought to practical use. Phase shift lithography is a method for enhancing the resolution of photolithography by changing only a mask without changing an optical system. When a phase difference is applied between exposure lights transmitted through the photo mask, mutual interference of the transmitted lights can be utilized to rapidly enhance the resolution.

The phase shift mask is a mask which uses light strength information together with phase information. Various types of masks are known such as Levenson type, auxiliary pattern type, and self-matching type (edge emphasizing type). These phase shift masks have a complicated structure and require a high degree of manufacturing technique as compared with the conventional photo mask which uses only light strength information.

In recent years, a so-called halftone type phase shift mask has been developed as one of the phase shift masks.

In a halftone phase shift mask, a light semi-transmission section has two functions: a shield function of substantially shielding the exposure light and a phase shift function of shifting (usually reversing) a light phase. Therefore, it is unnecessary to separately form a shield film pattern and a phase shift film pattern. This type of phase shift mask is structurally simple and easy to manufacture.

In a halftone phase shift mask, a mask pattern is processed by a dry etching process. However, when providing the shield function and phase shift function by separate layers, a high degree of control is necessary for both the layer having the shield function and the layer having the phase shift function in order to obtain a satisfactory pattern shape. On the other hand, when creating a single-layer light semi-transmission portion having both the shield function and the phase shift function, a single etching process can be used. Therefore, the manufacturing process of such a mask can be simplified, and a satisfactory pattern shape can easily be obtained.

Figure 10:
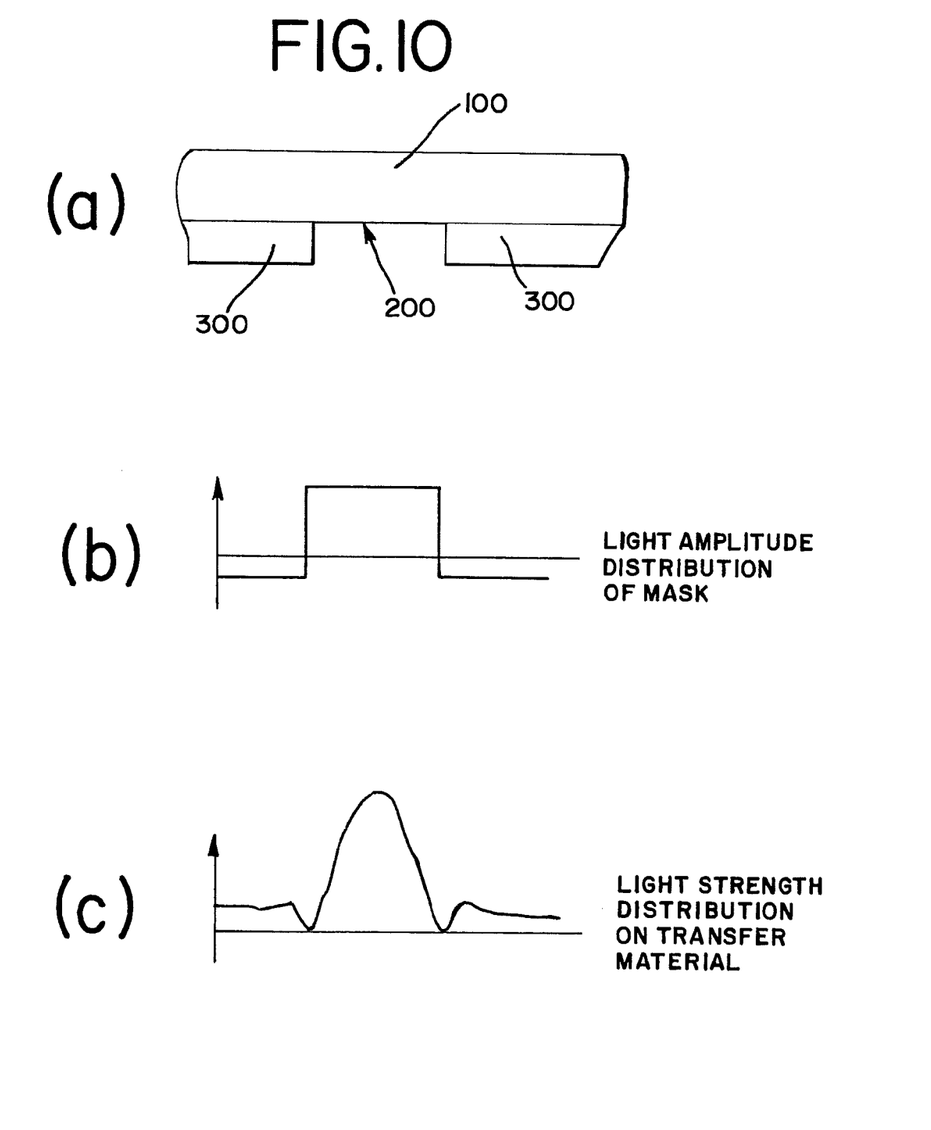
FIG. 10 is a schematic diagram showing a sputtering apparatus of the present invention.

For the halftone phase shift mask, as shown in FIG. 10, a mask pattern formed on a transparent substrate 100 is constituted of a light transmission portion (transparent substrate exposed portion) 200 for transmitting a light which is strong enough to substantially contribute to exposure and a light semi-transmission portion (shield and phase shifter portion) 300 for transmitting a light which is not strong enough to substantially contribute to the exposure (FIG. 10A). Additionally, the phase of the light transmitted through the light semi-transmission portion is shifted to a substantially reversed relation with respect to the phase of the light transmitted through the light transmission portion (FIG. 10B). The oppositely-phased lights transmitted in the vicinity of a boundary between the light semi-transmission portion and the light transmission portion cancel each other on account of diffraction phenomenon. Thereby, light strength in the boundary is substantially set to zero and, in contrast, resolution in the vicinity of the boundary is enhanced (FIG. 10C).

Additionally, the light semi-transmission portion or film (phase shift layer) in the halftone phase shift mask or blank needs to indicate a required optimum value with respect to both transmittance and phase shift amount. For example, (1) the transmittance in exposure wavelength of i-ray, KrF excimer laser, ArF excimer laser, or the like can be adjusted in a range of 3 to 20%, (2) a phase angle can be adjusted usually to a value in the vicinity of 180° in the exposure wavelength, and (3) the transmittance needs to be usually testable in a range of 65% or less in test wavelengths such as 257 nm, 266 nm, 364 nm, and 488 nm.

However, by shortening the wavelength of the laser for use in the exposure to ArF excimer laser (193 nm) from i-ray (365 nm) and KrF excimer laser (248 nm), the following problem is generated in the conventional halftone phase shift mask and the manufacturing method of the mask.

That is, in mass production of the phase shift mask blanks, when there are dispersions of the phase angle and transmittance among the blanks or in the plane, the yield is bad. Particularly in mask blanks for the short wavelength of ArF or $F_2$ excimer lasers, the dispersions of the phase angle and transmittance among the blanks and in the plane in conventional mask blanks for i-ray and KrF excimer laser are large, and the yield is bad. Therefore, the resulting mask blanks cannot be used.

SUMMARY OF THE INVENTION

The present invention has been developed under the aforementioned background, and a first object thereof is to provide a manufacturing method of a phase shift mask blank in which dispersions of a phase angle and transmittance among blanks can be reduced as much as possible and the yield is satisfactory.

Moreover, a second object is to provide a manufacturing method of a phase shift mask blank in which the dispersions of the phase angle and transmittance in a plane of the blanks can be reduced as much as possible and the yield is satisfactory.

Furthermore, a third object is to provide a manufacturing apparatus of a phase shift mask blank in which the dispersions of the phase angle and transmittance among the blanks can be reduced as much as possible and which can be manufactured with a satisfactory yield.

Additionally, a fourth object is to provide a manufacturing apparatus of a phase shift mask blank in which the dispersions of the phase angle and transmittance in the plane of the blanks can be reduced as much as possible and which can be manufactured with a satisfactory yield.

To achieve the aforementioned objects, the present invention has the following constitutions:

(Constitution 1) A method of continuously manufacturing a plurality of phase shift mask blanks each having at least a phase shift film on a transparent substrate, the method comprising a step of:

using a sputtering method to continuously form the phase shift film on the transparent substrate, wherein the dispersion of a phase angle of the phase shift film among the plurality of blanks is within ±2°.

(Constitution 2) A method of continuously manufacturing a plurality of halftone phase shift mask blanks each having at least a light semi-transmission film on a transparent substrate, the method comprising a step of:

using a sputtering method to continuously form the light semi-transmission film on the transparent substrate, wherein the dispersions of a phase angle and transmittance of the light semi-transmission film among the plurality of halftone phase shift mask blanks are within ±2° and ±4%, respectively.

(Constitution 3) A method of continuously manufacturing a plurality of photo mask blanks each having at least a thin film for forming a pattern on a transparent substrate, the method comprising a step of:

using a sputtering method to continuously form the thin film on the transparent substrate, wherein the sputtering method includes the steps of: successively supplying a plurality of transparent substrates into a sputtering chamber, forming the thin film for forming the pattern in the sputtering chamber, and discharging the transparent substrate with the film formed thereon from the sputtering chamber; wherein the transparent substrates are supplied and discharged substantially at a constant interval in order to set a film formation time which is constant among the plurality of blanks, and discarding at least the first five photo mask blanks obtained in the step.

(Constitution 4) The manufacturing method according to constitution 3 wherein the thin film for forming the pattern is a phase shift film, and the photo mask blank is a phase shift mask blank.

(Constitution 5) The manufacturing method according to constitution 3 wherein the thin film for forming the pattern is a light semi-transmission phase shift film, and the photo mask blank is a halftone phase shift mask blank.

(Constitution 6) A manufacturing method of a photo mask blank having a thin film for forming at least a pattern on a transparent substrate, the method comprising the steps of:

rotating the substrate; sputtering a target disposed opposite to a position whose center axis deviates from a center axis of the substrate; and forming the thin film.

(Constitution 7) The manufacturing method according to constitution 6 wherein the target and the substrate are disposed so that opposite surfaces of the substrate and target form a predetermined angle therebetween.

(Constitution 8) The manufacturing method according to constitution 6 or 7 wherein the step of forming the film comprises a step of rotating the transparent substrate an integral number of times between the start of film formation and the end of the film formation.

(Constitution 9) The manufacturing method according to any one of constitutions 6 to 8 wherein the thin film for forming the pattern is a phase shift film, and the photo mask blank is a phase shift mask blank.

(Constitution 10) The manufacturing method according to constitution 9 wherein a dispersion of a phase angle of the phase shift film in a plane is within ±2°.

(Constitution 11) The manufacturing method according to any one of constitutions 6 to 10 wherein the thin film for forming the pattern is a light semi-transmission phase shift film, and the photo mask blank is a halftone phase shift mask blank.

(Constitution 12) The manufacturing method according to constitution 11 wherein a dispersion of a phase angle of the light semi-transmission phase shift film in a plane is within ±2° and a dispersion of a transmittance in the plane is within ±4%.

(Constitution 13) The manufacturing method according to constitution 11 or 12 wherein the light semi-transmission phase shift film is formed by sputtering the target, which is formed of a metal and silicon, in an atmosphere containing nitrogen, such that the resulting content of nitrogen in the light semi-transmission phase shift film is larger than the content of silicon therein.

(Constitution 14) A photo mask manufactured by patterning the thin film onto the photo mask blank according to any one of constitutions 1 to 13.

(Constitution 15) A pattern transfer method of using the photo mask according to constitution 14 to transfer a pattern.

(Constitution 16) A manufacturing apparatus of a photo mask blank, comprising at least: a load lock mechanism for introducing substrates one by one; a sputtering chamber for forming a film on a substrate; a load lock chamber; a substrate-conveying mechanism for introducing the substrates one by one to the sputtering chamber from the load lock chamber at a constant interval; and an unload lock mechanism for discharging the substrates one by one from the sputtering chamber.

(Constitution 17) A manufacturing apparatus of a photo mask blank, comprising: a substrate holder having a rotation mechanism; and a target disposed opposite to a position whose center axis deviates from a center axis of a substrate.

(Constitution 18) The manufacturing apparatus according to constitution 17 wherein the target and the substrate are disposed so that opposite surfaces of the substrate and target form a predetermined angle therebetween.

(Constitution 19) The manufacturing apparatus of the halftone phase shift mask blank according to any one of constitutions 16 to 18, comprising: means for detecting a rotation position of the substrate; and means for turning OFF the electric discharge (ending film formation) when the substrate has completed an integral number of rotations after turning ON the electric discharge (starting the film formation), so as to allow the substrate to reach the same rotation angle position as the rotation angle position when the electric discharge was turned ON.

According to constitutions 1 and 2, the dispersion of the phase angle of the phase shift film among the phase shift mask blanks is within ±2°, or the dispersions of the phase angle and transmittance of the light semi-transmission film among the halftone phase shift mask blanks are within ±2° and within ±4%, respectively. Therefore, the phase shift masks for a short wavelength of ArF or $F_2$ excimer laser can be mass-produced for practical use. When this range is exceeded, it is difficult to mass-manufacture and practically use the phase shift mask for the short wavelength of ArF or $F_2$ excimer lasers.

Additionally, even in the present situation, masks for KrF excimer lasers can be practically used. However, smaller dispersions of the phase angle and transmittance of the light semi-transmission film among the mask blanks are preferable. Therefore, the invention according to constitutions 1 and 2 can also be applied to phase shift mask blanks for KrF excimer lasers.

According to constitutions 3 to 5, the dispersions of film properties (transmittance (OD), film thickness, and the like) among the blanks can be suppressed. It is particularly possible to realize the manufacture of a phase shift mask in which the dispersion of the phase angle of the phase shift film among the phase shift mask blanks is within ±2°, or the dispersions of the phase angle and transmittance of the light semi-transmission film among the halftone phase shift mask blanks are within ±2° and within ±4%, respectively.

According to constitutions 6 to 12, the dispersions of the film properties (transmittance (OD), film thickness, and the like) in the plane in the photo mask blank can be suppressed. It is particularly possible to realize a phase shift mask blank in which the dispersion of the phase angle of the phase shift film in the plane of the phase shift mask blank is within ±2°, or the dispersions of the phase angle and transmittance of the light semi-transmission film in the plane of the halftone phase shift mask blank are within ±2° and within ±4%, respectively. Therefore, a phase shift mask for the short wavelength of an ArF or $F_2$ excimer laser can be brought to practical use. When this range is exceeded, it is difficult to practically use the phase shift mask for the short wavelength of an ArF or $F_2$ excimer laser.

Additionally, even in the present situation, the mask for a KrF excimer laser can be practically used. However, smaller dispersions of the phase angle and transmittance of the light semi-transmission film in the plane of the mask blank are preferable. Therefore, the invention according to constitutions 6 and 12 can also be applied to the phase shift mask blank for a KrF excimer laser.

According to constitution 13, the dispersion of the phase angle can further be suppressed.

According to constitution 14, it is possible to obtain the photo mask in which the dispersion among the masks or in the mask plane is suppressed.

According to constitution 15, a superior patterning process can be realized.

According to the apparatus of constitutions 16 to 19, the dispersions of the film properties (transmittance (OD), film thickness, and the like) in the photo mask blank among the blanks or in the plane can be suppressed. It is particularly possible to realize the manufacture of a phase shift mask blank in which the dispersion of the phase angle of the phase shift film among the phase shift mask blanks or in the plane is within ±2°, or the dispersions of the phase angle and transmittance of the light semi-transmission film among the halftone phase shift mask blanks or in the plane are within ±2° and within ±4%, respectively.

The present invention will be described hereinafter in more detail.

As a result of research conducted in order to achieve the aforementioned objects, the following has been discovered:

In a halftone phase shift mask, it is functionally important to adjust the phase angle and transmittance of the light semi-transmission portion, so as to obtain the desired values. For an error range of the phase angle and transmittance, fluctuation among blanks (dispersion among blanks), and in-blank distribution (in-plane dispersion) is required to be about ±20 and ±4%, respectively. Examples of factors which change the phase angle and transmittance include: (1) the film formation procedure of the light semi-transmission film; (2) the characteristics of the sputtering apparatus used for forming the light semi-transmission film, and (3) the material of the light semi-transmission film.

(1) The film formation procedure for forming the light semi-transmission film will be described in detail.

In the process of determining a film formation time of the light semi-transmission film for a sputtering step, when an interval between consecutive sputtering steps is set to be constant, fluctuations of the phase angle and transmittance among blanks (dispersion among blanks) within ±2° and within ±4%, respectively, will result in enhanced reproducibility of effective blanks. In sputtering phenomenon, temperature and surface state of a target or a shield may be changed, and the degree of vacuum in a vacuum tank may also be changed. In a conventional intermittent sputtering process in which the interval between the end of one sputtering step and the start of the next sputtering step is not constant, the state of the target or the shield changes every moment. However, in the present invention, wherein: the interval between sputtering steps, the duration of each sputtering step, and surface condition are always set to be constant, the fluctuations of the phase angle and transmittance are reduced after initially forming five to ten blanks. That is, when the light semi-transmission film is continuously formed at a constant interval, and the first five to ten blanks formed are discarded, it is possible to steadily manufacture halftone phase shift mask blanks having less fluctuations of the phase angle and transmittance. Concretely, it is possible to steadily manufacture halftone phase shift mask blanks in which the dispersions of the phase angle and transmittance among the blanks are within ±2° and within ±4%, respectively.

Figure 1:
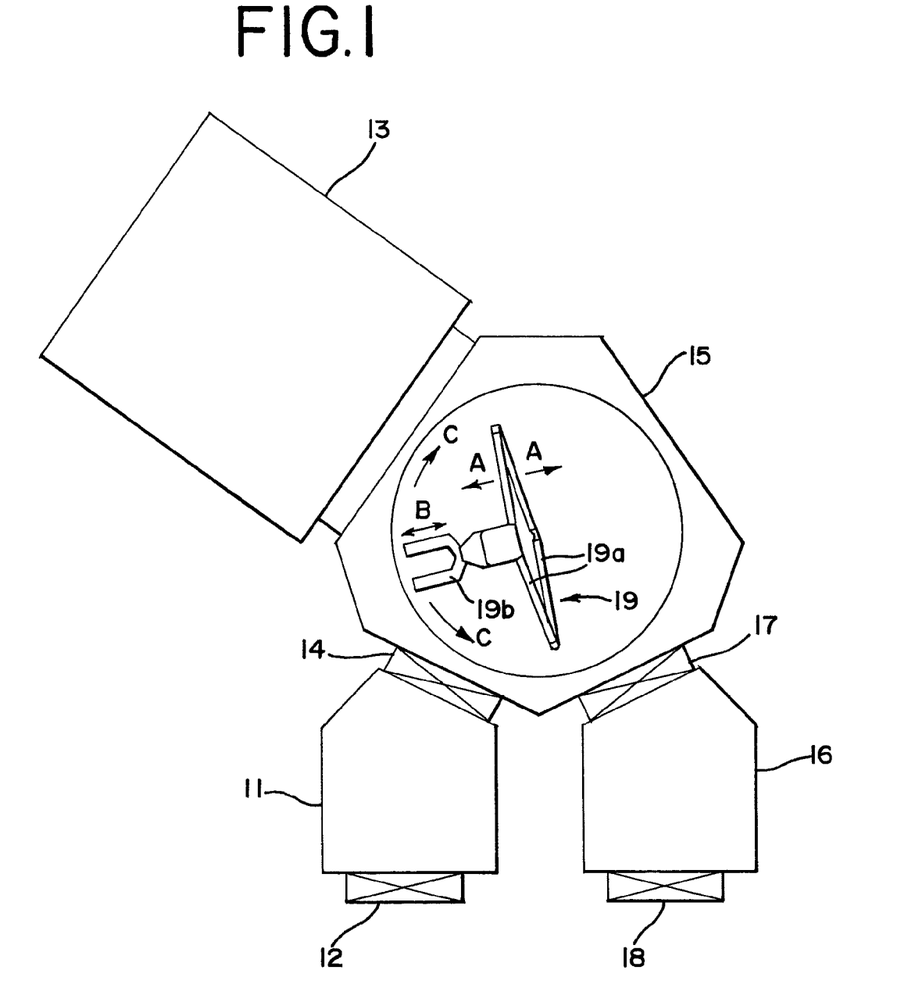
FIG. 1 is an explanatory view of the transfer principles used in the manufacture of a halftone phase shift mask according to the present invention.

In order to realize this process, as shown in FIG. 1, a load lock mechanism, which can constantly hold a sputtering vacuum tank (sputtering chamber) in a high vacuum state, is needed. In such an apparatus, introduction of the substrate to the sputtering chamber from a load lock chamber is continuously performed at a constant interval. For this, a load lock mechanism for introducing the substrates one by one is needed. Additionally, the capacity of the load lock chamber needs to be designed such that the substrate is continuously introduced to the sputtering chamber from the load lock chamber at the constant interval.

In the conventional manufacturing apparatus of halftone phase shift mask blanks, about ten substrates are simultaneously set in the load lock chamber. In this system (or an in-line system), since the capacity of the load lock chamber is large, much time is required for setting the inside of the load lock chamber to a predetermined degree of vacuum, and film formation is not performed in the sputtering chamber during this time. Therefore, when the film formation for one batch of substrates ends and the next cassette is set in the load lock chamber in order to perform film formation, the substrates are not being continuously supplied to the sputtering chamber at a constant interval. In this case, when the substrates are not continuously introduced to the sputtering chamber at a constant interval, the film formation in the sputtering chamber is not stabilized, the dispersions of the phase angle and transmittance among the blanks are large in the first five to ten blanks, and yield is disadvantageously bad.

In FIG. 1, a valve 12 for separating a load lock chamber 11 from the atmosphere, and a valve 14 for separating the load lock chamber 11 from a sputtering chamber 13 are attached to the load lock chamber 11. The load lock chamber 11 has a valve system in which the substrate can continuously be introduced to the sputtering chamber at the constant interval as described above. The load lock chamber is also designed to have a predetermined capacity. The sputtering chamber 13 has a function equivalent to a function of the vacuum tank in which sputtering is performed as described later and shown in FIG. 2. When the substrate is introduced to the sputtering chamber 13 by a robot arm, a conveying chamber 15 may be disposed between the sputtering chamber 13 and the load lock chamber 11. For a robot arm 19, when an arm 19a opens/closes in a direction A, a hand 19b can move in a direction B. Moreover, the robot arm 19 can rotate in a direction C. The robot arm 19 is also designed to be movable in a vertical direction with respect to a sheet surface. Furthermore, in order to enhance the efficiency of film formation, an unload lock chamber 16 having a design similar to that of the load lock chamber 11 may be added. An example of the process for forming the light semi-transmission film on the transparent substrate will be described with reference to FIG. 1.

1) After the valve 14 is closed, the inside of the load lock chamber 11 is set to atmospheric pressure through venting.

2) The valve 12 is opened and one transparent substrate is introduced into the load lock chamber 11.

3) The valve 12 is closed and the load lock chamber 11 is evacuated.

4) After the load lock chamber 11 reaches a predetermined degree of vacuum, the valve 14 is opened and the transparent substrate is moved to the sputtering chamber 13.

Figure 2:
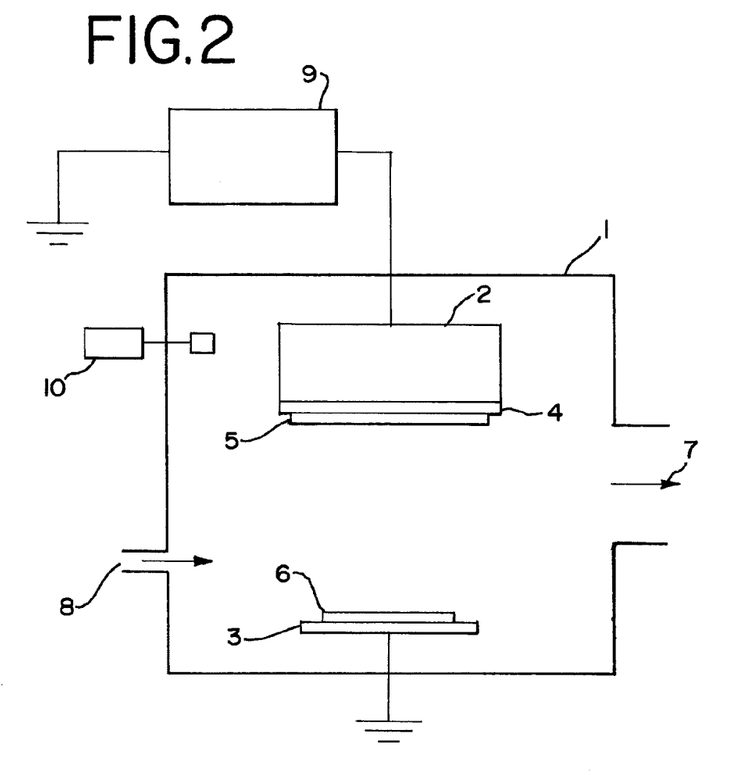
FIG. 2 is a schematic view of a sputtering chamber in a DC magnetron sputtering apparatus used in an embodiment.

5) An assembly described later and shown in FIG. 2 is used to form the light semi-transmission film in the sputtering chamber 13.

6) After the end of formation of the light semi-transmission film, a valve 17 is opened and the substrate is moved to the unload lock chamber 16. In this case, it is necessary to depressurize the unload lock chamber 16 to the predetermined degree of vacuum.

7) After the valve 17 is closed, the unload lock chamber is brought to atmospheric pressure through venting.

8) A valve 18 is opened and the substrate is removed.

From the time when the light semi-transmission film is formed in the sputtering chamber 13, until the substrate is moved to the unload lock chamber 16 from the sputtering chamber 13, steps 1) to 4) are ended, and the next substrate is allowed to be on standby in the load lock chamber 11. When the previous film formation ends, and the substrate is moved to the unload lock chamber 16 from the sputtering chamber 13, the transparent substrate having been on standby is moved to the sputtering chamber 13, and the light semi-transmission film is successively formed. By this process, it is possible to successively (continuously) form the light semi-transmission film at the constant interval excluding a time of maintenance of the apparatus.

(2) The characteristics of the sputtering apparatus for forming the light semi-transmission film will next be described in detail. Since gas pressure during the sputtering for forming the light semi-transmission film, output of a sputtering DC power supply, and sputtering time directly influence the transmittance and phase angle, precision of a gas flow rate controller, DC power supply or another apparatus needs to be enhanced. It is also necessary to enhance the precision of a set signal emitted from the controller. Since the gas pressure during the sputtering is also influenced by exhaust conductance of the apparatus, a mechanism able to accurately determine an open degree of an exhaust port valve and a position of the shield is also necessary. A suitable control mechanism will be described later.

Moreover, for a film containing silicon nitride, moisture generated from an inner wall of the vacuum tank, or the presence of another gas, largely influences an optical property of the film. It is therefore necessary to include a pump which can sufficiently evacuate the vacuum tank, and a mechanism which can bake the inner wall of the vacuum tank. The degree of vacuum in the vacuum tank needs to be about $2\times10^5$ pa or less at a film formation speed of 10 nm/min, and $1\times10^{-5}$ pa or less at a film formation speed of 5 nm/min.

Furthermore, in order to suppress the distributions of the phase angle and transmittance in the blanks (dispersions in the plane) to within ±2° and ±4%, respectively, the transparent substrate needs to be rotated during the film formation. It is further necessary to rotate the transparent substrate an integral number of times between the start and the end of the film formation step. To this end, for example, the rotation angle position of the substrate when the electric discharge is turned ON (start of film formation) is detected by a sensor. Furthermore, as per another function of this sensor, after the substrate completes an integral number of rotations and reaches the same rotation angle position as at the time that the electric discharge was turned ON, the electric discharge is turned OFF (film formation is ended). Such a sensor mechanism needs to be included.

The distributions of the phase angle and transmittance in the plane also change with a positional relation between the substrate and the target. The positional relation between the target and the substrate will be described with reference to FIG. 8.

Figure 8:
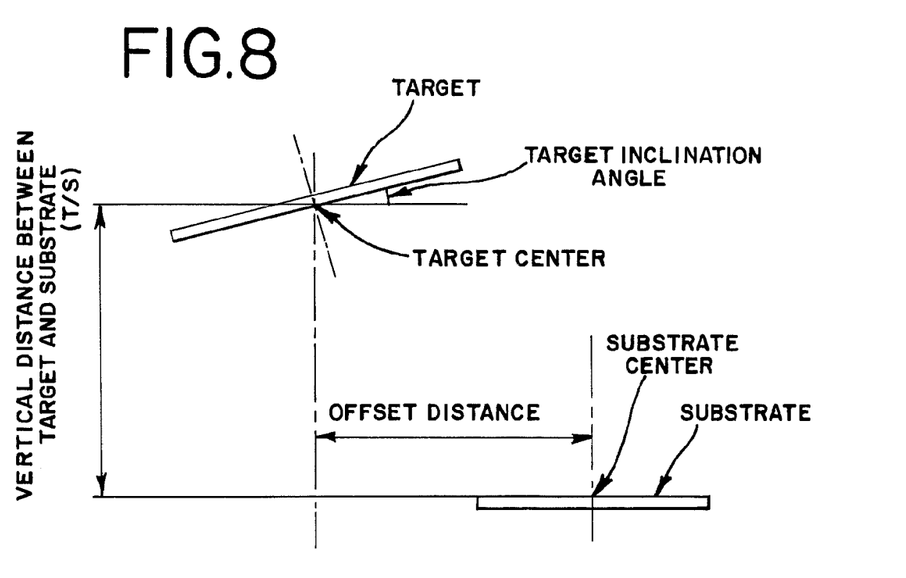
FIG. 8 is a schematic diagram showing the positional relation between a target and a substrate.

An offset distance (distance between a center axis of the substrate and a straight line passed through a center of the target and extended in parallel to the center axis of the substrate) is adjusted by an area in which the distributions of the phase angle and transmittance are to be secured. Generally in a large area in which the distributions are to be secured, a large offset distance is necessary. In order to realize the phase angle distribution within ±2° and transmittance distribution within ±4% in a 152 mm square substrate as in the present embodiment, the offset distance needs to be in a range of about 200 mm to 350 mm, and a preferable offset distance is in a range of 240 mm to 280 mm.

An optimum range of a vertical distance between the target and the substrate (T/S) changes with the offset distance. However, in order to realize the phase angle distribution within ±2° and transmittance distribution within ±4% in the 152 mm square substrate, the vertical distance between the target and the substrate (T/S) needs to be about 200 mm to 380 mm, and preferably T/S is in a range of 210 mm to 300 mm.

A target inclination angle influences the film formation speed. In order to obtain a high film formation speed, an appropriate target inclination angle is in a range of 0° to 45°, and a preferable target inclination angle is in a range of 10° to 30°.

Figure 9:
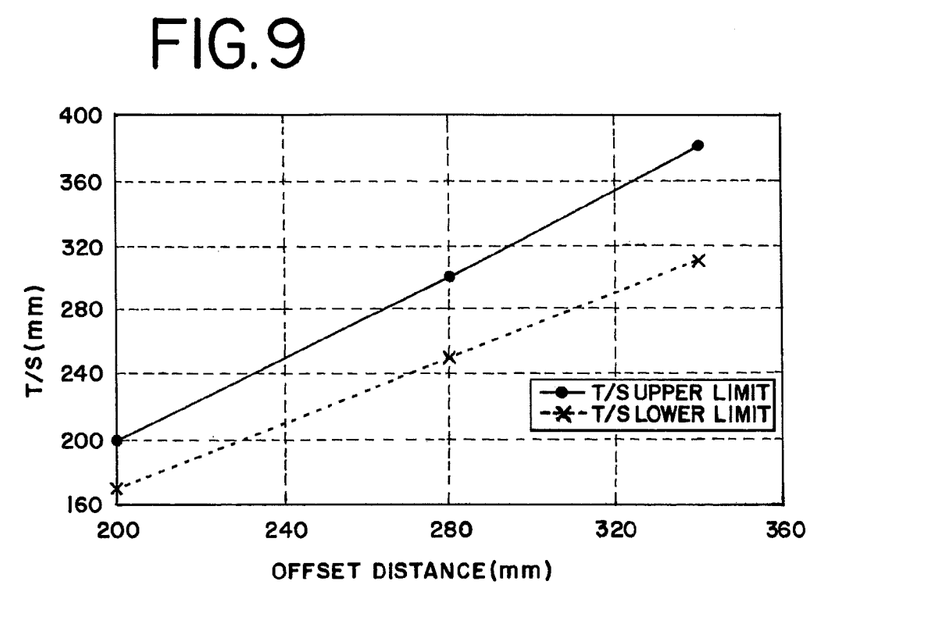
FIG. 9 is a graph showing upper and lower limits of T/S with which a phase angle distribution within ±2° and a transmittance distribution within ±4% can be realized for a given offset distance.

FIG. 9 shows upper and lower limits of T/S with which a phase angle distribution within ±2° and transmittance distribution within ±4% can be realized in the 152 mm square substrate for a particular offset distance.

(3) The influence of the material of the light semi-transmission film on the phase angle and transmittance will next be described in detail. The phase angle and transmittance of the light semi-transmission film change with the film formation speed and degree of nitriding. The film formation speed and degree of nitriding are influenced by a nitrogen partial pressure during sputtering. However, when the light semi-transmission film is completely nitrided, the influence of the nitrogen partial pressure during sputtering is reduced. In a nitrided metal silicide film, a flow rate of nitrogen introduced during sputtering is adjusted so that the content of nitrogen measured by ESCA is larger than that of silicon. This can reduce the influence of a fluctuation of nitrogen partial pressure on the optical property. With this method, the distributions of the phase angle and transmittance in the plane can also be reduced. Additionally, when oxygen is added together with nitrogen during sputtering, the phase angle and transmittance are largely influenced by a fluctuation of the flow rate of oxygen. However, at least the influence of flow rate fluctuation of nitrogen can be reduced in the aforementioned method.

Additionally, the photo mask blanks of the present invention may include a shield film (chromium, a chromium compound containing oxygen, nitrogen, carbon, and the like in chromium, another chromium compound, and the like) in the photo mask, the phase shift film in the phase shift mask blank, and the like.

Moreover, the phase shift mask blank of the present invention is not limited to the halftone phase shift mask blank. For a purpose of setting the dispersion of the phase angle within ±2°, the present invention can also be applied to a blank for manufacturing various types of phase shift masks such as Levenson type, auxiliary pattern type, and self-matching type (edge emphasizing type).

DETAILED DESCRIPTION OF THE PREFERRED EMBODIMENTS

Examples of the present invention will be described hereinafter in further detail.

The DC magnetron sputtering apparatus described above with reference to FIG. 1 was used to continuously form films of 200 halftone phase shift mask blanks for an ArF excimer laser (193 nm) one by one at constant intervals.

Concretely, a mixed target (Mo:Si=8:92 mol %) of molybdenum (Mo) and silicon (Si) was used to form a nitrided thin film (film thickness of about 670 angstroms) of molybdenum and silicon (MoSiN) on a transparent substrate by reactive sputtering (DC sputtering) in a mixed gas atmosphere (Ar: $N_2$=10%:90%, pressure: 0.1 Pa) of argon (Ar) and nitrogen ($N_2$). In this manner, the phase shift mask blank (film composition: Mo:Si:N=7:45:48) for an ArF excimer laser (wavelength of 193 nm) was obtained.

Here, a sputtering chamber 13 in the DC magnetron sputtering apparatus shown in FIG. 1 has a vacuum tank 1 as shown in FIG. 2. A magnetron cathode 2 and substrate holder 3 are disposed in the vacuum tank 1. A sputtering target 5 bonded to a backing plate 4 is attached to the magnetron cathode 2. In the example, oxygen-free steel is used in the backing plate 4, and indium is used to bond the sputtering target 5 to the backing plate 4. The backing plate 4 is directly or indirectly cooled by a water cooling mechanism. The magnetron cathode 2, backing plate 4 and sputtering target 5 are electrically connected to one another. A transparent substrate 6 is attached to the substrate holder 3.

Additionally, in a constitution of the apparatus used in the present example, the sputtering target 5 and substrate 6 in FIG. 2 are arranged so that opposite surfaces of the substrate and target form a predetermined angle as shown in FIG. 8. In this case, the offset distance between the sputtering target and the substrate was set to 340 mm, the vertical distance between the target and the substrate (T/S) was 380 mm, and the target inclination angle was 15°.

The vacuum tank 1 is evacuated by a vacuum pump via an exhaust port 7. When the pressure in the vacuum tank reaches a degree of vacuum which does not influence a property of the formed film, a mixed gas containing nitrogen is then introduced via a gas introduction port 8, a DC power supply 9 is used to apply a negative voltage to the magnetron cathode 2, and sputtering is performed. The DC power supply 9 has an arc detecting function, and can monitor an electric discharge state during sputtering. The pressure inside the vacuum tank 1 is measured by a pressure gauge 10.

The transmittance of a light semi-transmission film formed on the transparent substrate is adjusted according to the type and mixture ratio of gases introduced via the gas introduction port 8. When the mixed gas contains argon and nitrogen, the transmittance is increased by increasing the ratio of nitrogen. When a desired transmittance cannot be obtained by adjusting the ratio of nitrogen, oxygen is added to the mixed gas containing nitrogen, and the transmittance can further be increased.

The phase angle of the light semi-transmission film was adjusted by a sputtering time, and the phase angle in an exposure wavelength was adjusted to about 180°.

Evaluation of Dispersion Among Blanks

Dispersions of the phase angle and transmittance among the blanks formed as described above were checked with respect to 200 phase shift mask blanks (size: 15.2 cm square). Results are shown in FIG. 3.

Figure 3:
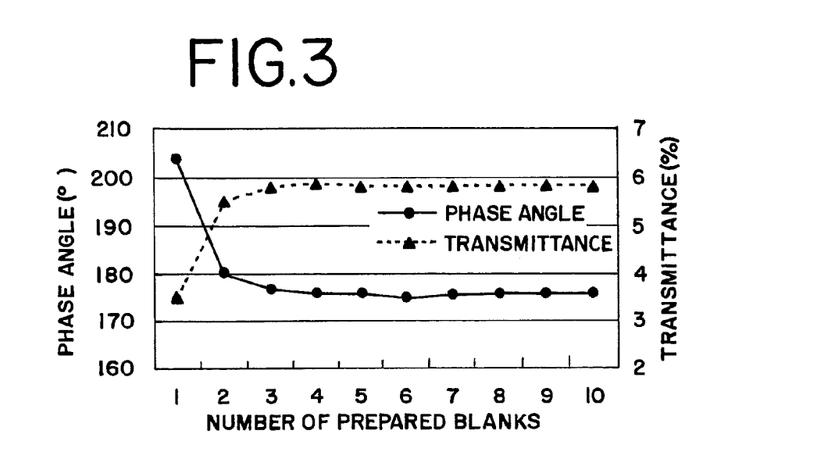
FIG. 3 is a graph showing dispersions of a phase angle and transmittance among blanks in the embodiment.

As seen from FIG. 3, on and after the third blank, halftone phase shift mask blanks whose dispersions of the phase angle and transmittance among the blanks are within ±2° and within ±4%, respectively, can steadily be manufactured. Additionally, it was confirmed also with respect to the 11-th blank to 200-th blank that the dispersions of the phase angle and transmittance among the blanks were within ±2° and within ±4%, respectively. In this case, yield is 100% with respect to the phase angle and transmittance.

Additionally, in Example 2, 200 blanks were prepared similarly as the aforementioned Example 1 except that the sputtering chamber was opened for maintenance midway (at the 190-th blank), and the dispersions of the phase angle and transmittance among the blanks were checked. Results are shown in FIG. 4.

Figure 4:
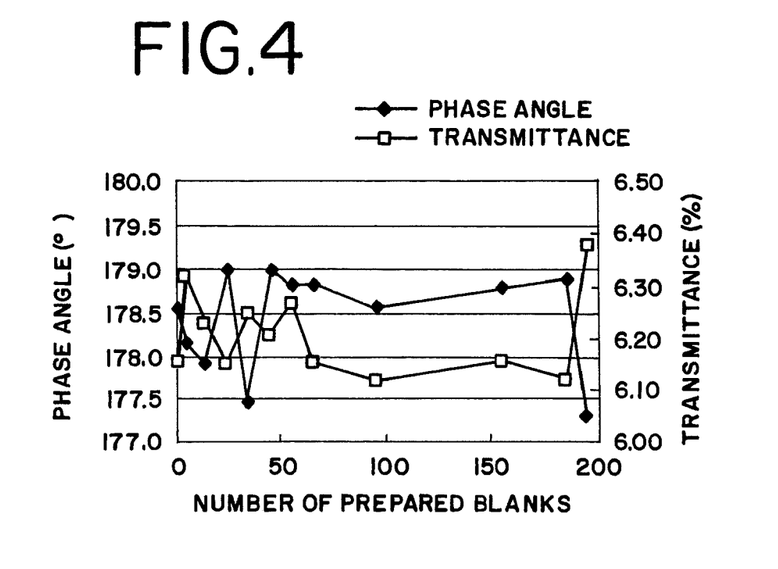
FIG. 4 is a graph showing dispersions of the phase angle and transmittance among the blanks in another embodiment.

As seen from FIG. 4, with use of the apparatus of the present invention, the halftone phase shift mask blanks whose dispersions of the phase angle and transmittance among the blanks are within ±2° and within ±4%, respectively, can steadily be manufactured, excluding the first several blanks initially produced and the five blanks immediately produced after opening the sputtering chamber for maintenance. It is also seen that the yield is 100% with respect to the phase angle and transmittance.

In a conventional manufacturing apparatus either about ten substrates were simultaneously introduced into a load lock chamber or an in-line type manufacturing apparatus was used to manufacture the halftone phase shift mask blanks. However, in either apparatus, it was difficult to suppress the dispersions of the phase angle and transmittance among the blanks to within ±2° and within ±4%, respectively, and the yield was bad.

Moreover, in Example 1, the transparent substrate was rotated during film formation. Furthermore, the transparent substrate completed an integral number of rotations between the start and end of the film formation, while the film formation was performed. The dispersions of the phase angle and transmittance in a plane were checked.

As a result, it was confirmed that halftone phase shift mask blanks having dispersions of the phase angle and transmittance in the plane within ±2° and ±4%, respectively, can steadily be manufactured.

Furthermore, the following was seen in the aforementioned examples.

Figure 5:
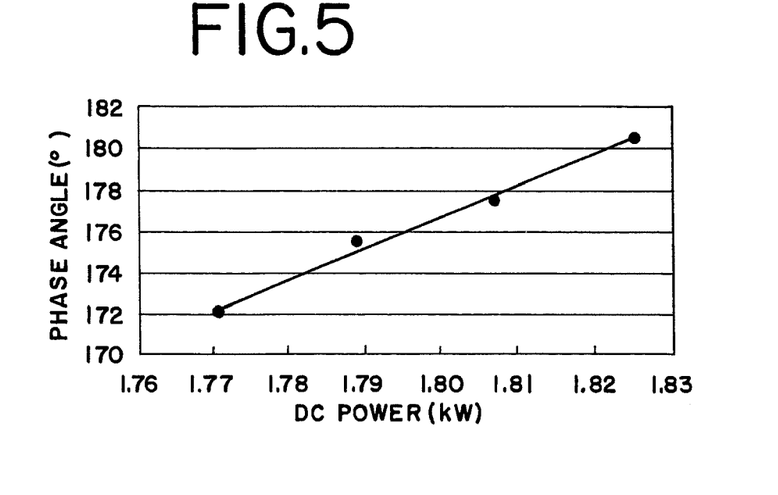
FIG. 5 is a graph showing the relation between DC power and phase angle.

As shown in FIG. 5, in order to suppress the dispersion of the phase angle to a range of about 180° to about 172°, it is necessary to maintain the power of the DC power supply in a range of about 1.77 kW to about 1.825 kW (preferably in a range of about 1.82 kW to 1.81 kW in order to suppress the dispersion of the phase angle to a range of about 180° to about 178°). Therefore, it is necessary to suppress a fluctuation of the power of the DC power supply from a center value to ±0.5%.

Figure 6:
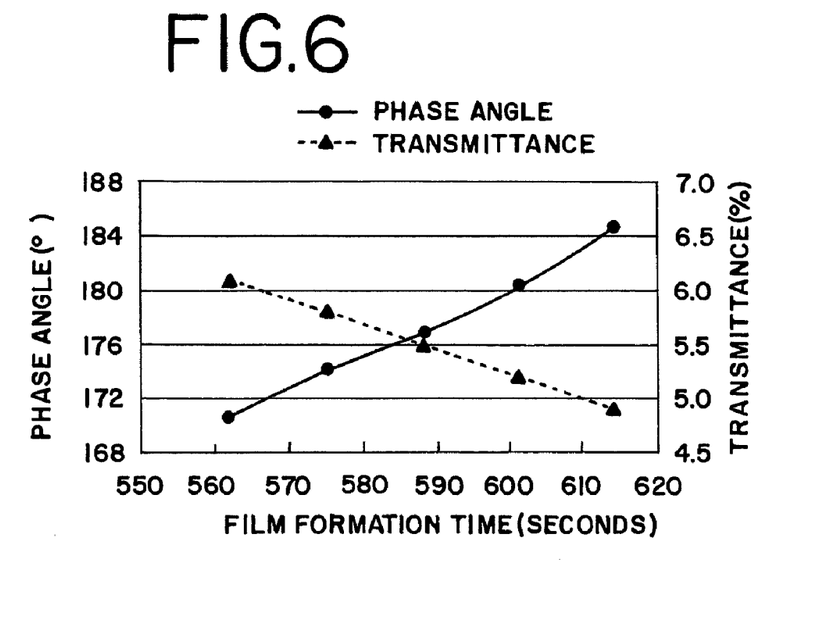
FIG. 6 is a graph showing the relation between film formation time and the phase angle and transmittance.

Similarly, as seen from FIG. 6, in order to suppress the dispersions of the phase angle and transmittance, it is necessary to maintain the film formation time in a range of about 560 seconds to about 615 seconds (preferably about 600 seconds to about 594 seconds in order to suppress the dispersion of the phase angle to a range of about 180° to about 178°). Therefore, it is necessary to suppress a fluctuation of the film formation time from a center value to 0.5%.

Figure 7:
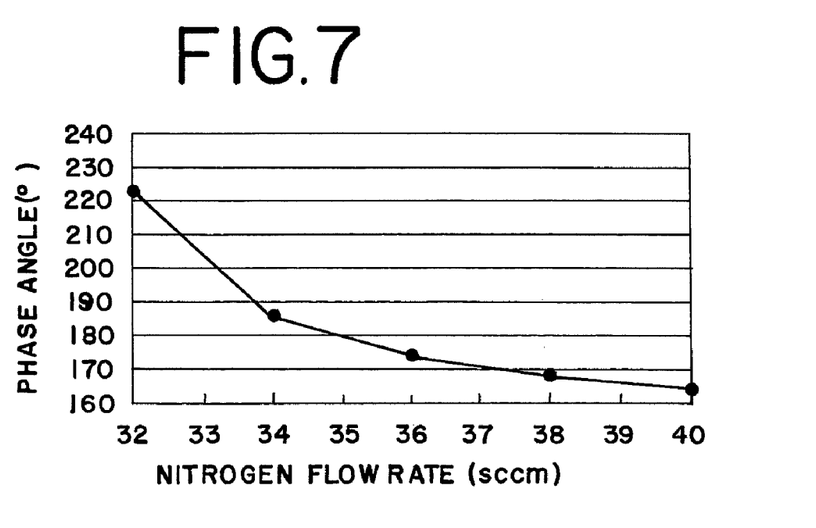
FIG. 7 is a graph showing the relation between nitrogen flow rate and phase angle.

Similarly, as seen from FIG. 7, in order to suppress the dispersion of the phase angle, the flow rate of nitrogen introduced during sputtering is adjusted so that the content of nitrogen measured by ESCA in a nitrided metal silicide film is larger than the content of silicon, and the influence of a fluctuation of nitrogen partial pressure on an optical property is reduced. For this purpose, it is necessary to maintain the flow rate of nitrogen in a range of about 35 sccm or more (preferably about 35 sccm to about 35.5 sccm in order to suppress the dispersion of the phase angle to a range of about 180° to about 178°). Additionally, the nitrogen flow rate at which the influence of the fluctuation of nitrogen partial pressure on the optical property can be reduced changes with an exhaust property and DC power of the apparatus.

Evaluation of Dispersion in Plane

The dispersions of the phase angle and transmittance in a plane were checked with respect to one of the phase shift mask blanks obtained as described above.

As a result, the dispersion of the phase angle was within ±0.8% (average value of 179.5°, range of 178.8° to 180.3°) in a range of 132 mm square excluding a substrate peripheral portion of 10 mm. Moreover, the dispersion of the transmittance was within ±1.3% (average value of 6.16%, range of 6.08% to 6.23%).

Additionally, for comparison, when the film formation was performed at an offset distance of 340 mm, a vertical distance between the target and the substrate (T/S) of 400 mm, and a target inclination angle of 15°, the dispersion of the phase angle was ±3.5° (average value of 178.8°, range of 175.3° to 181.7°). Moreover, the dispersion of the transmittance was ±8% (average value of 6.07%, range of 5.83% to 6.56%).

Furthermore, for comparison, when the target was disposed opposite to the substrate (offset distance of 0 mm, and target inclination angle of 0°), the dispersion of the phase angle was ±2.7° (average value of 179.8°, range of 177.1° to 182.0°) for a target with a diameter of 16 inches. Moreover, the dispersion of the transmittance was +4.2% (average value of 6.19%, range of 6.00% to 6.45%).

With a larger offset distance, it is easier to reduce the dispersion in the plane. However, when the offset distance is excessively large, the capacity of the vacuum tank increases, evacuation or depressurization is therefore deteriorated, and film formation speed is lowered.

Additionally, the dispersion in the plane was evaluated by judging whether or not both a maximum point (plus value) and minimum point (minus value) with respect to the average value (center value) were within a defined range.

The preferred examples of the present invention have been described above, but the present invention is not limited to the aforementioned examples.

For example, molybdenum was used as a metal constituting the light semi-transmission film, but this is not required, and zirconium, titanium, vanadium, niobium, tantalum, tungsten, nickel, palladium, and the like can be used.

Moreover, a target of molybdenum and silicon was used as the target containing metal and silicon, but this is not limiting. In a target containing metal and silicon, molybdenum is particularly superior among the aforementioned metals in controlling the transmittance and, further, because target density increases and particles in the film can be reduced through the use of a sputtering target containing metal and silicon. Titanium, vanadium, and niobium are superior in resistance to an alkaline solution, but slightly inferior to molybdenum in the target density. Tantalum is superior in its resistance to the alkaline solution and target density, but slightly inferior to molybdenum in controlling transmittance. Tungsten has properties similar to those of molybdenum, but is slightly inferior to molybdenum in an electric discharge property during sputtering. Nickel and palladium are superior in the optical property and resistance to the alkaline solution, but dry etching is slightly difficult to perform. Zirconium is superior in its resistance to the alkaline solution, but inferior to molybdenum in the target density, and the dry etching is slightly difficult to perform. Considering these, molybdenum is most preferable at present. Molybdenum is also preferable for a nitrided molybdenum and silicon (MoSiN) thin film (light semi-transmission film), with its superior chemicals resistance such as acid resistance and alkali resistance.

Moreover, in order to obtain the thin film of a composition in which electric discharge stability is secured during film formation and various properties of the phase shift mask are satisfied, the target containing 70 to 95 mol % of silicon, and the metal is preferably subjected to DC magnetron sputtering in an atmosphere containing nitrogen. Thereby, a light semi-transmission film containing nitrogen, metal and silicon is preferably formed.

When the content of silicon in the target is larger than 95 mol %, a voltage is not easily applied (electricity is not easily passed) to a target surface (erosion portion) in the DC sputtering, and the electric discharge becomes unstable. Moreover, when the content of silicon is less than 70 mol %, a film constituting a light semi-transmission portion with a high transmittance cannot be obtained. Furthermore, electric discharge stability is further enhanced by combination of the nitrogen gas with the DC sputtering.

Additionally, the electric discharge stability during film formation also influences film quality. When the electric discharge stability is superior, a light semi-transmission film with a satisfactory film quality is obtained.

As described above, according to the present invention, there can be provided the manufacturing method of the phase shift mask blank in which the dispersions of phase angle and transmittance among blanks can be reduced as much as possible and the yield is satisfactory.

Moreover, there can be provided the manufacturing method of a phase shift mask blank in which the dispersions of phase angle and transmittance in the plane of the blanks can be reduced as much as possible and the yield is satisfactory.

Furthermore, there can be provided the manufacturing apparatus for a phase shift mask blank in which the dispersions of phase angle and transmittance among the blanks can be reduced as much as possible and which can be manufactured with a satisfactory yield.

Additionally, there can be provided the manufacturing apparatus for a phase shift mask blank in which the dispersions of phase angle and transmittance in the plane of the blanks can be reduced as much as possible and which can be manufactured with a satisfactory yield.

What is claimed is:

1. An apparatus for forming thin film on each of a plurality of substrate to make photo-mask blanks, comprising:
    a sputtering chamber for carrying out sputtering to form the thin film on a surface of each substrate in a sputtering time, comprising therein:
    a single sputtering target,
    a target holder, and
    a substrate holder capable of holding a substrate in a horizontal state, having a rotation mechanism and being rotatable around its center axis, wherein the number of rotations of the substrate is controlled to be an integer during the film formation,
    said substrate holder and said target holder being placed so that the target is held opposite to the substrate and a center axis of the target deviates from a center axis of the substrate;
    a first load lock mechanism for introducing the substrate into the sputtering chamber and a second load lock mechanism for discharging the substrate with a film formed thereon in the sputtering chamber, each of said first load lock mechanism and the second load lock mechanism comprising a load lock chamber, and
    a conveyer for conveying each of the plurality of substrates one by one for introducing each of the substrates into the sputtering chamber,
    wherein said conveyer is capable of conveying one substrate at a time to introduce the substrate in the sputtering chamber so that the sputtering time for carrying out the sputtering for a substrate and an interval time which runs from an end of sputtering for one substrate to a start of sputtering for a next substrate are respectively made constant, and
    wherein the load lock chamber is capable of accepting one substrate at one time, so that introducing each substrate into and discharging each substrate from the sputtering chamber can be continuously made at a constant interval.

2. The apparatus of claim 1 wherein the first load lock mechanism is capable of keeping a substrate subject to the film forming standby until a substrate with film formed thereon by a previous film forming is transferred to the second load lock mechanism.

3. The apparatus of claim 2 wherein said load lock mechanism is capable of venting for making the inside room of the load lock chamber into atmospheric pressure for transferring the substrate with outside, evacuating the inside room of the load lock chamber up to a predetermined degree of vacuum for transferring the substrate with the sputtering chamber.

4. The apparatus of claim 1 wherein the substrate holder and the target holder are placed so that a surface of the substrate on which the film is formed and a surface of the target forms a predetermined angle.

5. The apparatus of claim 4 wherein the predetermined angle is 10 to 30 degree.

6. The apparatus of claim 4 wherein the predetermined angle is 10 to 15 degree.

7. The apparatus of claim 1 wherein the film formation is controlled by detecting a rotation angle of the substrate from the start to the end of the film forming so that the number of rotations of the substrate during the film formation is an integer.

8. The apparatus of claim 1 wherein a position of the substrate at the start of film forming is detected by an sensor, and, when the same position is detected by the sensor after an integer times of rotation of the substrate, the film forming is stopped.

* * * * *